United States Patent
Cai et al.

(10) Patent No.: US 8,765,491 B2
(45) Date of Patent: Jul. 1, 2014

(54) SHALLOW TRENCH ISOLATION RECESS REPAIR USING SPACER FORMATION PROCESS

(75) Inventors: Ming Cai, Hopewell Junction, NY (US); Xi Li, Somers, NY (US); Frank D. Tamweber, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 12/914,095

(22) Filed: Oct. 28, 2010

(65) Prior Publication Data

US 2012/0104500 A1 May 3, 2012

(51) Int. Cl.
- H01L 21/00 (2006.01)
- H01L 21/76 (2006.01)
- H01L 21/70 (2006.01)

(52) U.S. Cl.
USPC .............................. 438/4; 438/435; 257/368

(58) Field of Classification Search
USPC ....................... 438/4, 435; 257/368
See application file for complete search history.

(56) References Cited

U.S. PATENT DOCUMENTS

| | | | |
|---|---|---|---|
| 6,146,970 A | 11/2000 | Witek et al. | |
| 6,165,871 A | 12/2000 | Lim et al. | |
| 6,251,747 B1 | 6/2001 | Zheng et al. | |
| 6,657,244 B1 * | 12/2003 | Dokumaci et al. | 257/288 |
| 6,802,944 B2 * | 10/2004 | Ahmad et al. | 204/192.23 |
| 7,087,483 B2 | 8/2006 | Huang et al. | |
| 7,087,531 B1 * | 8/2006 | Furukawa et al. | 438/704 |
| 7,179,711 B2 | 2/2007 | Adachi et al. | |
| 7,223,698 B1 | 5/2007 | Bonser et al. | |
| 7,335,545 B2 | 2/2008 | Currie | |
| 7,488,660 B2 | 2/2009 | Dyer et al. | |
| 2002/0158286 A1 * | 10/2002 | Chediak et al. | 257/325 |
| 2008/0237733 A1 | 10/2008 | Chen et al. | |
| 2009/0023258 A1 | 1/2009 | Liang et al. | |
| 2009/0032900 A1 * | 2/2009 | Wang et al. | 257/510 |
| 2009/0184341 A1 | 7/2009 | Chong et al. | |
| 2011/0115000 A1 * | 5/2011 | Yang | 257/288 |

OTHER PUBLICATIONS

IBM, "Technical Disclosure: A Simple Method to Reduce STI Recess for Stress Nitride Fill at Sub-32nm Technology Nodes," published by IBM on Apr. 22, 2009, in IP.COM, IPCOM000182028D.

* cited by examiner

*Primary Examiner* — Karen Kusumakar
(74) *Attorney, Agent, or Firm* — Cantor Colburn LLP; Ian MacKinnon

(57) ABSTRACT

A method of forming a semiconductor device includes forming a spacer layer over a plurality of transistor gate structures, the transistor gate structures being formed over both active and shallow trench isolation (STI) regions of a substrate. The spacer layer is subjected to a directional etch so as to form sidewall spacers adjacent the plurality of transistor gate structures, and a horizontal fill portion of the spacer layer remains in one more recesses present in the STI regions so as to substantially planarize the STI region prior to subsequent material deposition thereon.

13 Claims, 5 Drawing Sheets

SHALLOW TRENCH ISOLATION RECESS REPAIR USING SPACER FORMATION PROCESS

BACKGROUND

The present invention relates generally to semiconductor device manufacturing and, more particularly, to a structure and method for shallow trench isolation (STI) recess repair prior to silicide processing, using a gate spacer layer.

A typical semiconductor device in a complementary metal-oxide-semiconductor (CMOS) circuit is formed in a p-well or an n-well in a semiconductor substrate. Since other semiconductor devices are also present in the semiconductor substrate, a given semiconductor device requires electrical isolation from adjacent semiconductor devices. Electrical isolation is provided by isolation structures that employ trenches filled with an insulator material (e.g., shallow trench isolation or "STI" regions).

In addition, certain inactive areas of a semiconductor device defined by STI regions may also have so called "dummy" gate structures formed thereon. These dummy gate structures on the STI regions are electrically non-functional, but serve one or more mechanical purposes. For example, substantially planar surfaces within a semiconductor topography may play an important role in fabricating overlying layers and structures. That is, step coverage problems may arise when a material is deposited over a surface having raised and recessed regions. Step coverage is defined as a measure of how well a film conforms over an underlying step and is expressed by the ratio of the minimum thickness of a film as it crosses a step to the nominal thickness of the film over horizontal regions. Furthermore, correctly patterning layers upon a surface containing fluctuations in elevation may be difficult using optical lithography.

In general, a topography having relatively wide regions of material may also be more prone to dishing effects of chemical mechanical polishing (CMP) than a topography having relatively narrow regions of material. Thus, the dummy structures formed on the inactive STI regions of a semiconductor device can contribute to a substantially planar surface, but do not affect the functionality of the device.

However, during one or more cleaning processes (e.g., DHF/wet clean/Aqua Regia) used in the front-end-of-the-line (FEOL) processing, the STI regions may be subjected to the formation of severe recesses therein. Such recesses may occur, for example, during metal silicide formation on gate, source and drain contacts of a field effect transistor (FET). Unfortunately, a subsequent cap layer (e.g., nitride) that is formed over the silicided transistor devices can be pinched off so as to have a void formed therein, where such voids correspond to locations above the recessed STI. An STI recess therefore introduces a significant challenge for a middle-of-the-line (MOL) nitride layer to fill the gap between adjacent gates, especially at sub-32 nanometer (nm) ground rules. An incomplete gap fill, also known as a tungsten (W) subway void defect, remains a yield and reliability concern, even on electrically non-functional STI regions.

SUMMARY

In one aspect, a method of forming a semiconductor device includes forming a spacer layer over a plurality of transistor gate structures, the transistor gate structures being formed over both active and shallow trench isolation (STI) regions of a substrate; and subjecting the spacer layer to a directional etch so as to form sidewall spacers adjacent the plurality of transistor gate structures, and wherein a horizontal fill portion of the spacer remains in one more recesses present in the STI region so as to substantially planarize the STI regions prior to subsequent material deposition thereon.

In another aspect, a method of forming a semiconductor device includes forming a nitride spacer layer over a plurality of transistor gate structures, the transistor gate structures being formed over both active and shallow trench isolation (STI) regions of a substrate; subjecting the nitride spacer layer to a directional etch so as to form nitride sidewall spacers adjacent the plurality of transistor gate structures, wherein a horizontal fill portion of the nitride spacer layer remains in one more recesses present in the STI region so as to substantially planarize the STI regions prior to subsequent material deposition thereon; and wherein the nitride spacer layer is formed at an initial thickness sufficient to both facilitate sidewall spacer formation and to prevent pinch off of the spacer layer at locations corresponding to the one or more recesses.

In another aspect, a method of forming a semiconductor device includes forming a nitride spacer layer over a plurality of transistor gate structures, the transistor gate structures being formed over both active and shallow trench isolation (STI) regions of a substrate; masking the nitride spacer layer so as to protect portions of the nitride spacer layer over the STI regions; and subjecting exposed portions of the nitride spacer layer over the active regions to a directional etch so as to form nitride sidewall spacers adjacent the plurality of transistor gate structures; wherein the nitride spacer layer is formed at an initial thickness sufficient to both facilitate sidewall spacer formation in the active area and to prevent pinch off of the spacer layer at locations corresponding to one or more recesses present in the STI regions.

In another aspect, a semiconductor device includes a plurality of transistor gate structures, the transistor gate structures being formed over both active and shallow trench isolation (STI) regions of a substrate; at least a portion of the plurality of transistor gate structures having sidewall spacers formed adjacent thereto; and one more recesses present in the STI region being filled with horizontal portions material used to form the sidewall spacers so as to substantially planarize the STI regions.

BRIEF DESCRIPTION OF THE SEVERAL VIEWS OF THE DRAWINGS

Referring to the exemplary drawings wherein like elements are numbered alike in the several Figures:

FIGS. 2(a) through 2(c) are a series of cross sectional views illustrating a method of STI recess repair prior to silicide processing, in accordance with an exemplary embodiment of the invention, in which:

FIG. 2(a) illustrates a plurality of transistors formed on active and STI regions of a semiconductor device, wherein a portion of the STI region between adjacent transistor gates has a recess formed therein;

FIG. 2(b) illustrates the formation of a nitride spacer layer over the structure of FIG. 2(a);

FIG. 2(c) illustrates selective removal of portions of the nitride spacer layer of FIG. 2(b) so as to form sidewall spacers on the gate structure and to fill the STI region recess;

FIGS. 4(a) through 4(d) are a series of cross sectional views illustrating a method of STI recess repair prior to silicide processing, in accordance with an alternative embodiment of the invention, in which:

FIG. 4(a) illustrates a plurality of transistors formed on active and STI regions of a semiconductor device, wherein a portion of the STI region between adjacent transistor gates has a recess formed therein;

FIG. 4(b) illustrates the formation of a nitride spacer layer over the structure of FIG. 4(a);

FIG. 4(c) illustrates masking of the semiconductor device so as to expose the active region; and FIG. 4(d) illustrates selective removal of portions of the nitride spacer layer in the active regions of FIG. 4(c) remains to serve as a capping layer for the STI region gate structures.

DETAILED DESCRIPTION

Disclosed herein is a structure and method for STI recess repair prior to silicide processing, using a gate spacer layer. By forming a gate spacer layer (e.g., a nitride) within a specific thickness range, portions of the gate spacer layer between adjacent gates on STI layers can be selectively removed so as to both (1) fill in the STI recess caused by cleaning processes and (2) form sidewall spacers on the gate structures. This in turn prevents voids from being formed in post-silicidation cap layers formed over the gate structures.

Figure 1:
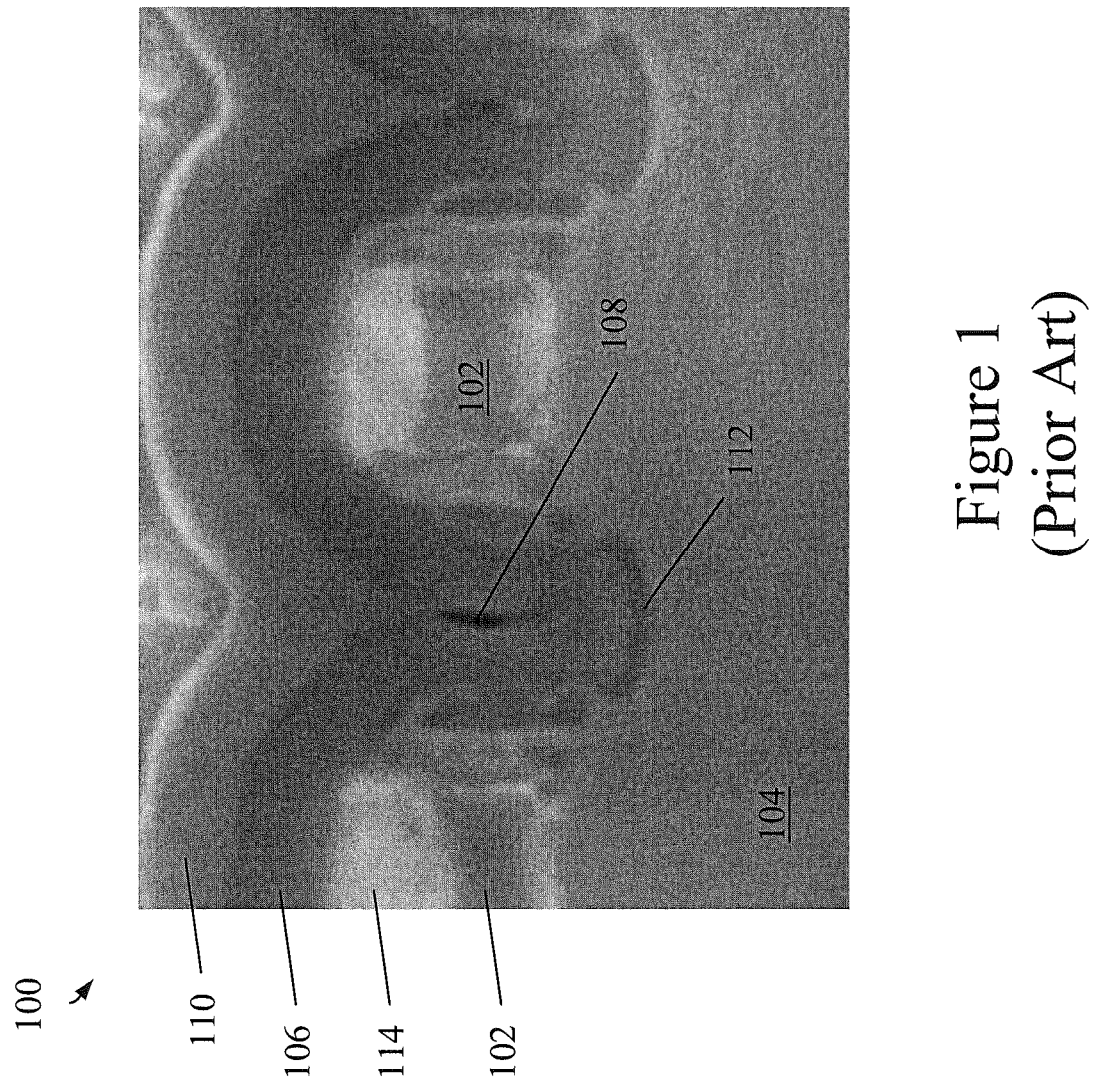
FIG. 1 is a scanning electron microscopy (SEM) image illustrating a void formed in a nitride cap layer as a result of recessing of STI material between adjacent gate structures.

Referring initially to FIG. 1, there is shown an SEM image of a conventionally formed semiconductor device 100 having gate structures 102 formed on an STI region 104 of the device 100. As can be seen from the image, a nitride cap layer 106 is pinched between adjacent gate structures 102 so as result in a void 108 that is not filled by the overlying interlevel dielectric (ILD) layer (e.g., oxide) 110 atop the nitride cap layer 106. The void 108 is present as a result of the STI recess 112 formed during cleaning processes in FEOL, which recess 112 exacerbated by a metal silicide process in forming silicide contacts 114.

Figure 2A:
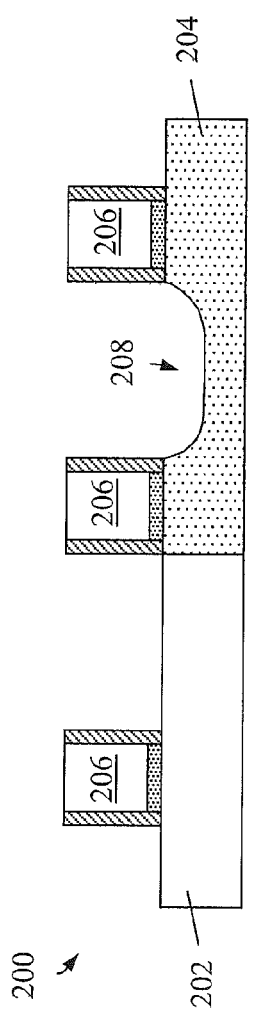
Figure 2B:
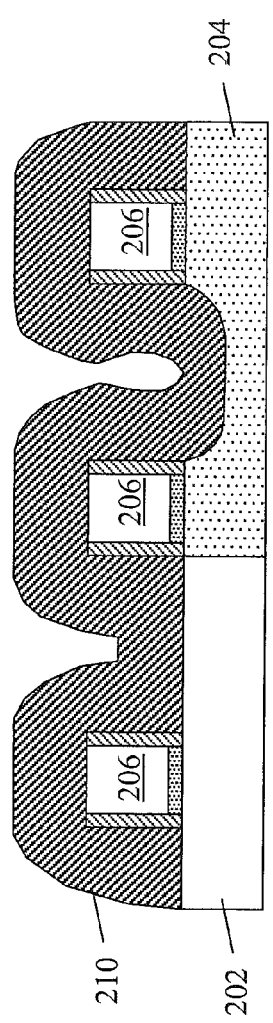
Figure 2C:
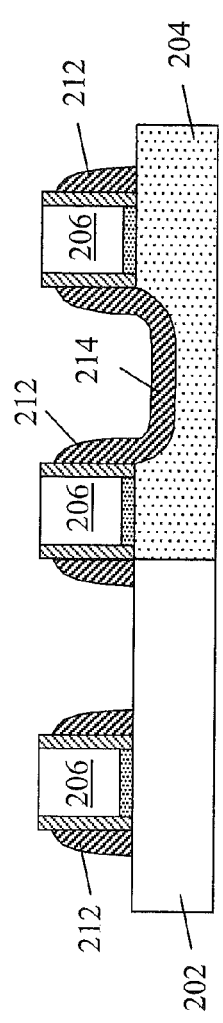

FIGS. 2(a) through 2(c) are a series of cross sectional views illustrating a method of STI recess repair prior to silicide processing, in accordance with an exemplary embodiment of the invention. In FIG. 2(a), a semiconductor device 200 includes an active area 202 and an STI area 204, both of which have transistor gate structures 206 formed thereon. As a result of various processing and cleaning operations as described above, a portion of the STI region 204 between adjacent transistor gates 206 has a recess 208 formed therein.

Then, as shown in FIG. 2(b), a nitride layer 210, such as a silicon nitride layer ($Si_3N_4$) is formed over the entire structure. The nitride layer deposition conditions are selected so as to result in a layer thickness that is sufficient to fill in the recess 208, and to allow for a gate sidewall spacer formation following a directional etch, but also thin enough so as to prevent a pinching off of the layer above the recess 208 in the STI region 204, as particularly shown in FIG. 2(b). Thus, the thickness of the nitride layer 210 should, at most, be slightly less than half the distance between adjacent gate structures in the STI region. The closer the nitride layer 210 comes to being pinched off above the recess, the more nitride material will be left in the recess following etching. However, if the nitride layer 210 is completely pinched off, this will prevent desired sidewall spacer formation.

Formed in this manner, the nitride layer 210 is then subjected to an anisotropic (directional) reactive ion etch (RIE) that results in the formation of nitride sidewall spacers 212 adjacent the gate structures 206 in both the active region 202 and the STI region. In addition, due to the near pinch off of the nitride layer 210, a horizontal fill portion 214 of nitride material remains in the STI recess so as to substantially planarize the STI region 204. In so doing, the subsequent formation of a nitride cap layer post-silicidation is prevented from the type of void formation discussed above.

Figure 3:
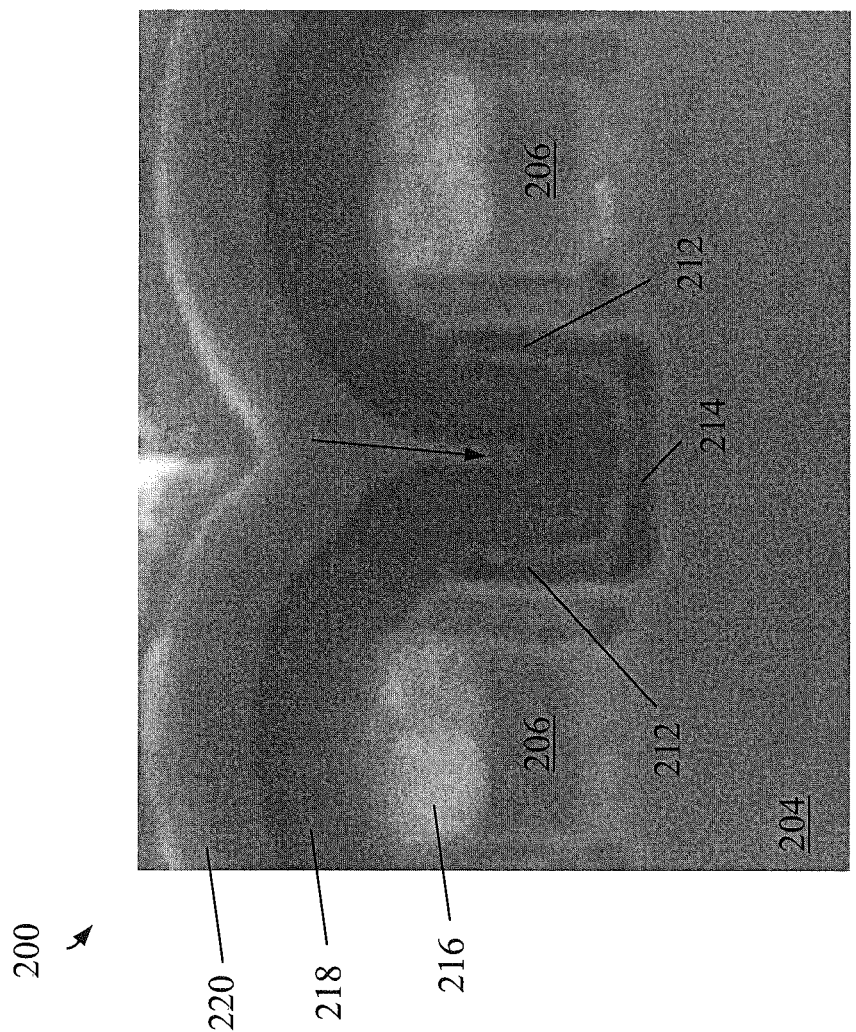
FIG. 3 is an SEM image of a resulting structure using the exemplary method of FIGS. 2(a) through 2(c), illustrating the prevention of a void formed in the nitride cap layer.

To further illustrate, FIG. 3 is an SEM image of a resulting structure using the exemplary method of FIGS. 2(a) through 2(c), illustrating the prevention of a void formed in the nitride cap layer. As can be seen from FIG. 3, the horizontal fill portion 214 of nitride fill material substantially planarizes the STI region 204, defining a U-shaped nitride structure along with the nitride sidewall spacers 212 between the gate structures 206. As will also be noted from FIG. 3, the presence of the horizontal fill portion 214 formed during nitride spacer formation and prior to silicide contact 216 formation also results in a less severe recess of the STI region 204 to begin with, since the nitride protects the STI oxide from additional recessing during contact metal removal and cleaning.

Consequently, a nitride cap layer 218 deposited after silicide contact formation does not pinch off (in contrast to the structure of FIG. 1). Thus, when an ILD oxide layer 220 is formed over the nitride cap layer 218, the oxide substantially conforms to the top surfaces of the nitride without the void formation, as indicated by the arrow in FIG. 3.

Figure 4A:
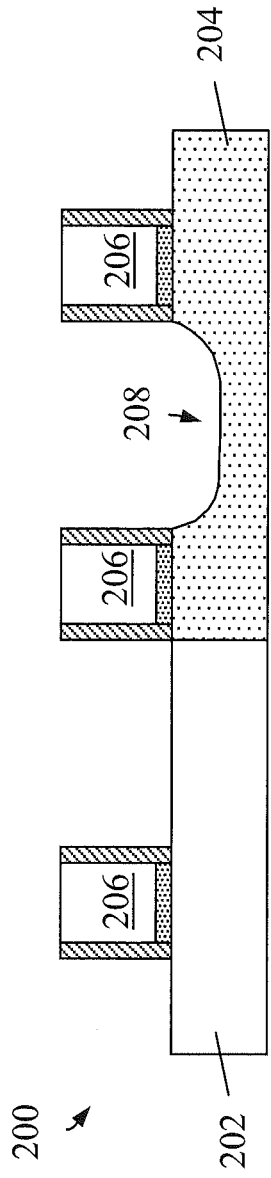
Figure 4B:
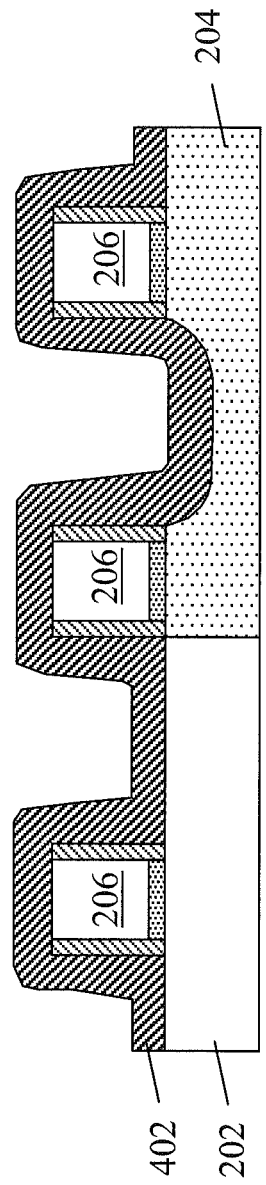

In lieu of creating nitride spacers in both the active and STI regions, FIGS. 4(a) through 4(d) are a series of cross sectional views illustrating a method of STI recess repair prior to silicide processing, in accordance with an alternative embodiment of the invention. In this process flow sequence, the starting structure (i.e., semiconductor device 200) of FIG. 4(a) is similar to that of FIG. 2(a). In FIG. 4(b), a nitride spacer layer 402 is formed over the active region 202 and STI region 204, including the recess 208. The nitride spacer layer 402 has a thickness that is suitable both for gate spacer formation on the active region 202, as wall as to fill the recess 208.

Figure 4C:
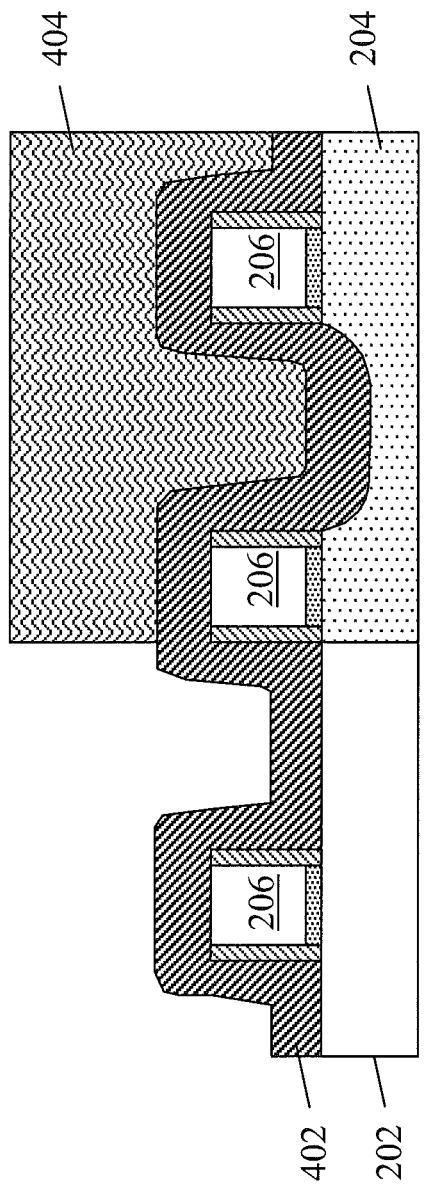
Figure 4D:
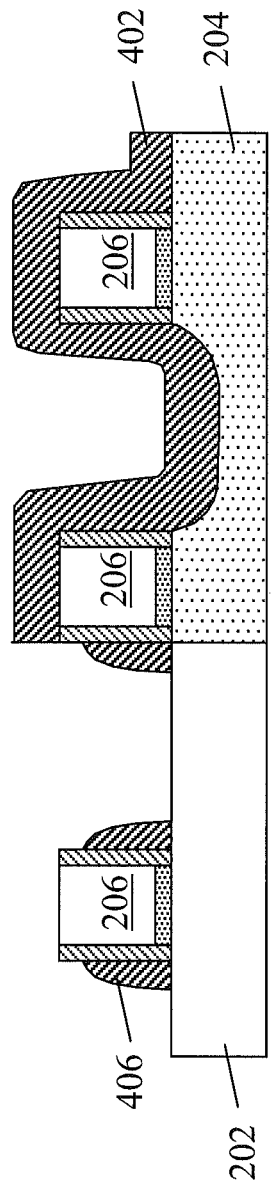

However, in this embodiment, prior to performing the nitride spacer RIE, the STI region 204 is masked with a protective layer 404, such as a photoresist or hardmask layer so as to expose only the portions of the nitride layer 402 over the active area 202, as shown in FIG. 4(c). Then, as shown in FIG. 4(d), the RIE forms nitride spacers 406 adjacent the gate structures of the active region 202, while the nitride layer 210 remains over the STI region as originally deposited. Instead of serving as a spacer layer in this region, the nitride layer 402 may instead be used as part of the nitride cap layer prior to ILD formation.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:

forming a spacer layer over a plurality of transistor gate structures, the transistor gate structures being formed over both active and shallow trench isolation (STI) regions of a substrate;

masking the spacer layer so as to protect portions of the spacer layer over the STI regions; and subjecting exposed portions the spacer layer to a directional etch so as to form sidewall spacers adjacent the plurality of transistor gate structures from vertical portions of the spacer layer, and wherein a horizontal fill portion of the spacer layer remains in one more recesses present in the STI region so as to substantially planarize the STI regions prior to subsequent material deposition thereon, wherein the horizontal fill portion has a substantially flat top surface, and wherein portions of the spacer layer over the STI regions remain on top surfaces of the transistor gate structures therein, while etched portions of the spacer layer over the active regions are removed from top surfaces of the transistor gate structures therein.

2. The method of claim 1, wherein the spacer layer is formed at an initial thickness sufficient to both facilitate sidewall spacer formation and to prevent pinch off of the spacer layer at locations corresponding to the one or more recesses.

3. The method of claim 2, wherein the initial thickness is slightly less than half the distance between adjacent transistor gate structures in the STI region.

4. The method of claim 1, wherein the spacer layer is formed prior to silicide contact formation on the plurality of transistor gate structures.

5. The method of claim 1, further comprising:
forming silicide contacts on the plurality of transistor gate structures;
forming a cap layer over the silicided transistor gate structures, the sidewall spacers and horizontal fill portions of the spacer layer; and
forming an interlevel dielectric (ILD) layer over the cap layer.

6. A method of forming a semiconductor device, the method comprising:
forming a nitride spacer layer over a plurality of transistor gate structures, the transistor gate structures being formed over both active and shallow trench isolation (STI) regions of a substrate;
masking the nitride spacer layer so as to protect portions of the nitride spacer layer over the STI regions; and
subjecting exposed portions of the nitride spacer layer over the active regions to a directional etch so as to form nitride sidewall spacers adjacent the plurality of transistor gate structures from vertical portions of the nitride spacer layer;
wherein the nitride spacer layer is formed at an initial thickness sufficient to both facilitate sidewall spacer formation in the active area and to prevent pinch off of the spacer layer at locations corresponding to one or more recesses present in the STI regions, and wherein portions of the nitride spacer layer over the STI regions remain on top surfaces of the transistor gate structures therein, while etched portions of the nitride spacer layer over the active regions are removed from top surfaces of the transistor gate structures therein.

7. The method of claim 6, wherein the nitride spacer layer over the STI regions serves as a nitride cap layer for the transistor gate structures over the STI regions.

8. A semiconductor device, comprising:
a plurality of transistor gate structures, the transistor gate structures being formed over both active and shallow trench isolation (STI) regions of a substrate;
at least a portion of the plurality of transistor gate structures having sidewall spacers formed from vertical portions of a spacer layer adjacent thereto;
one more recesses present in the STI region being filled with horizontal portions of the same spacer layer used to form the sidewall spacers so as to substantially planarize the STI regions, wherein the horizontal portions have a substantially flat top surface; and
wherein portions of the spacer layer formed over the STI regions remain on top surfaces of the transistor gate structures therein, while portions of the spacer layer initially formed over the active regions are removed from top surfaces of the transistor gate structures therein.

9. The device of claim 8, wherein the sidewall spacers comprise a nitride material.

10. The device of claim 9, wherein the plurality of transistor gate structures on both the active and STI regions have the sidewall spacers formed adjacent thereto.

11. The device of claim 9, wherein the plurality of transistor gate structures on the active regions have the sidewall spacers formed adjacent thereto, and the plurality of transistor gate structures on the STI regions have a spacer layer formed thereon at a thickness to prevent pinch off of the spacer layer at locations corresponding to the one or more recesses.

12. The device of claim 11, wherein the spacer layer thickness is slightly less than half the distance between adjacent transistor gate structures in the STI region.

13. The device of claim 9, further comprising:
silicide contacts formed on the plurality of transistor gate structures;
a cap layer formed over the silicided transistor gate structures, the sidewall spacers and horizontal fill portions of the sidewall spacer material; and
an interlevel dielectric (ILD) layer formed over the cap layer.

* * * * *